(12) United States Patent
Pallerla et al.

(10) Patent No.: US 9,418,716 B1
(45) Date of Patent: Aug. 16, 2016

(54) WORD LINE AND BIT LINE TRACKING ACROSS DIVERSE POWER DOMAINS

(71) Applicant: QUALCOMM Incorporated, San Diego, CA (US)

(72) Inventors: Arun Babu Pallerla, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/815,042

(22) Filed: Jul. 31, 2015

Related U.S. Application Data

(60) Provisional application No. 62/148,113, filed on Apr. 15, 2015.

(51) Int. Cl.
G11C 7/22 (2006.01)
G11C 5/14 (2006.01)
G11C 7/12 (2006.01)
G11C 7/14 (2006.01)

(52) U.S. Cl.
CPC .. *G11C 7/22* (2013.01); *G11C 5/14* (2013.01); *G11C 7/12* (2013.01); *G11C 7/14* (2013.01)

(58) Field of Classification Search
None
See application file for complete search history.

(56) References Cited

U.S. PATENT DOCUMENTS

| | | |
|---|---|---|
| 8,139,426 B2 | 3/2012 | Park et al. |
| 8,284,626 B2 | 10/2012 | Prasad et al. |
| 8,630,135 B2 | 1/2014 | Douzaka |
| 8,724,421 B2 | 5/2014 | Evans et al. |
| 2013/0182514 A1 | 7/2013 | Ge et al. |
| 2014/0025981 A1* | 1/2014 | Evans ............... G06F 1/10 713/501 |

* cited by examiner

*Primary Examiner* — James G Norman
(74) *Attorney, Agent, or Firm* — Haynes and Boone, LLP

(57) ABSTRACT

A bit line and word line tracking circuit is provided that accounts for the power-supply-voltage-dependent delays in a memory having a logic power domain powered by a logic power supply voltage and a memory power domain powered by a memory power supply voltage.

13 Claims, 5 Drawing Sheets

WORD LINE AND BIT LINE TRACKING ACROSS DIVERSE POWER DOMAINS

CROSS-REFERENCE TO RELATED APPLICATIONS

This application claims the benefit of U.S. Provisional Application No. 62/148,113, filed Apr. 15, 2015, the contents of which are hereby incorporated by reference in their entirety.

TECHNICAL FIELD

This application relates to memories, and more particularly to word line and bit line tracking across at least two power domains.

BACKGROUND

Write operations for a memory may occur responsive to an edge of a memory clock signal. For example, an address decoder decodes an address and raises the appropriate word line responsive to the memory clock signal edge. Similarly, an I/O circuit processes a data bit to drive a pair of bit lines with the appropriate differential voltage (one bit line being driven high and one low depending upon the binary value of the data bit) responsive to the memory clock signal edge. Since conventional address decoding involves considerably more logic, the delay from the clock edge to the word line assertion dominated over the delay from the data bit processing prior to driving the bit lines. Thus, the word line development delay was the critical path such that it was sufficient for a conventional memory to model this delay using a word line tracker. Once the word line tracker had finished modeling the word line development delay, a bit line tracker modeled the delay required to develop a bit line voltage responsive to the assertion of a "dummy" word line in the word line tracker.

The dummy word line is matched to the word line it models so that it has the substantially the same capacitance, resistance, and inductance (the same electrical properties) for the actual word line being modeled. The bit line tracker similarly includes a dummy bit line that also substantially matches the electrical properties for the bit lines. Based upon the delays modeled by the word line tracker and associated bit line tracker, a conventional memory could adjust its write operation timing so that a write operation could be finished successfully from one clock edge to a subsequent clock edge.

However, such traditional memory delay modeling is problematic in modern memory architectures. In particular, it is now routine for the core logic to be powered by an independent power supply rail (denoted herein as "CX") and for the memory to be powered by another independent power supply rail (denoted herein as "MX"). The CX power supply voltage level is thus independent of the MX power supply voltage level. Such independence saves power because the core logic can retain its state at lower levels for the logic power supply voltage as compared to the lowest level for the memory power supply voltage at which the memory still retains its state. The lower voltage level for the logic power supply voltage reduces leakage current loss and preserves battery life.

Given this logic power domain/memory power domain dichotomy, it is advantageous to push as much of the decoding in the bit line and word line paths into the logic power domain as possible since power consumption is proportional to the square of the power supply voltage. A traditional memory tracking scheme then becomes unfeasible as the location of the critical path with regard to being in the bit line development path or being in the word line development path depends upon the relative power supply voltages in the logic and memory power domains.

Accordingly, there is a need in the art for improved memory tracking architectures.

SUMMARY

Various delay modeling circuits are provided to model the word line and bit line delays in a memory having both a logic-power-domain portion and a memory-power-domain portion. In some aspects of the disclosure, the delay modeling circuit includes a first delay circuit configured to delay a memory clock by a simulated row decoding period to produce a first output signal. The first delay circuit includes a portion in the logic power domain that is configured to delay the memory clock signal to provide a delayed signal, the first delay circuit further including a first level-shifter in the memory power domain configured to level shift the delayed signal to produce the first output signal.

The delay modeling circuit further includes a second delay circuit configured to delay the memory clock signal by a simulated column decoding period to produce a second output signal. The second delay circuit includes a second level-shifter in the memory power domain that is configured to level-shift the memory clock signal into a memory-power-domain dummy write clock, the second delay circuit further including a portion in the memory-power-domain that is configured to delay the dummy write clock to produce the second output signal.

The delay modeling circuit also includes a logic circuit configured to process the first output signal and the second output signal to assert a logic output signal responsive to a completion of both the simulated row decoding period and the simulated column decoding period.

In other aspects of the disclosure, a method is provided that comprises simulating a row decoding period for a write operation in a memory using a first delay path in a logic power domain powered by a logic power supply voltage. The method further comprises simulating a portion of a column decoding period for the memory using a second delay path in a memory power domain powered by a memory power supply voltage that is different from the logic power supply voltage. In addition, the method includes an act that is responsive to the completion of both the simulated row decoding period and the simulated column decoding period portion and comprises simulating a word line charging period to model a word line development delay for the memory.

In yet additional aspects of the disclosure, a circuit is provided that includes a means for asserting a first output signal upon completion of a simulated row decoding period for a write operation in a memory using a first delay path in a logic power domain. The circuit also includes a means for asserting a second output signal upon completion of a simulated column decoding period for the write operation using a second delay path in a memory power domain. In addition, the circuit includes a logic circuit configured to assert a logic output signal responsive to the assertion of the first output signal and the assertion of the second output signal.

The memory tracking circuits disclosed herein advantageously simulate the row decoding period using a first delay line implemented in the logic power domain. Conversely, the memory tracking circuits simulate the column decoding period using a second delay line implemented in the memory power domain. Thus, regardless of what operating mode is used as the tracking circuit automatically accounts for the varying delays for the row decoding period and the column decoding period that will be induced responsive to the various levels for the memory and logic power supply voltages.

These and additional advantageous features may be better appreciated with regard to the following detailed description.

BRIEF DESCRIPTION OF THE DRAWINGS

Aspects of the present disclosure and their advantages are best understood by referring to the detailed description that follows. It should be appreciated that like reference numerals are used to identify like elements illustrated in one or more of the figures.

DETAILED DESCRIPTION

Word line and bit line delay modeling circuits are provided that account for the variable delays that occur in a memory circuit depending upon the various values for a logic power supply voltage powering a logic power domain and for a memory power supply voltage powering a memory power domain. To better appreciate these power domain influences on the delay required to write to a bit cell, consider an example memory 100 shown in FIG. 1A. A bit cell 190 couples to a bit line pair represented by bit line 185 responsive to an assertion of a word line 195 to the memory power supply voltage. Bit line 185 represents the bit line that is discharged to ground depending upon the binary value of the data bit being written to bit cell 190. Depending upon this binary value, bit line 185 may thus represent either the true bit line or the complement bit line in the bit line pair (not illustrated) that couples to bitcell 190. Once the write operation is completed, both the bit line 185 and word line 195 are released (word line 195 being discharged to ground while bit line 185 is recharged to the memory power supply voltage). To provide optimal memory operation, the release of bit line 185 and word line 195 should be timed appropriately. If these lines are released too soon, the write operation may not be completed such that a write error occurs. Conversely, if the release of these lines is needlessly delayed after the completion of the write operation, the memory operation speed suffers.

Figure 1A:
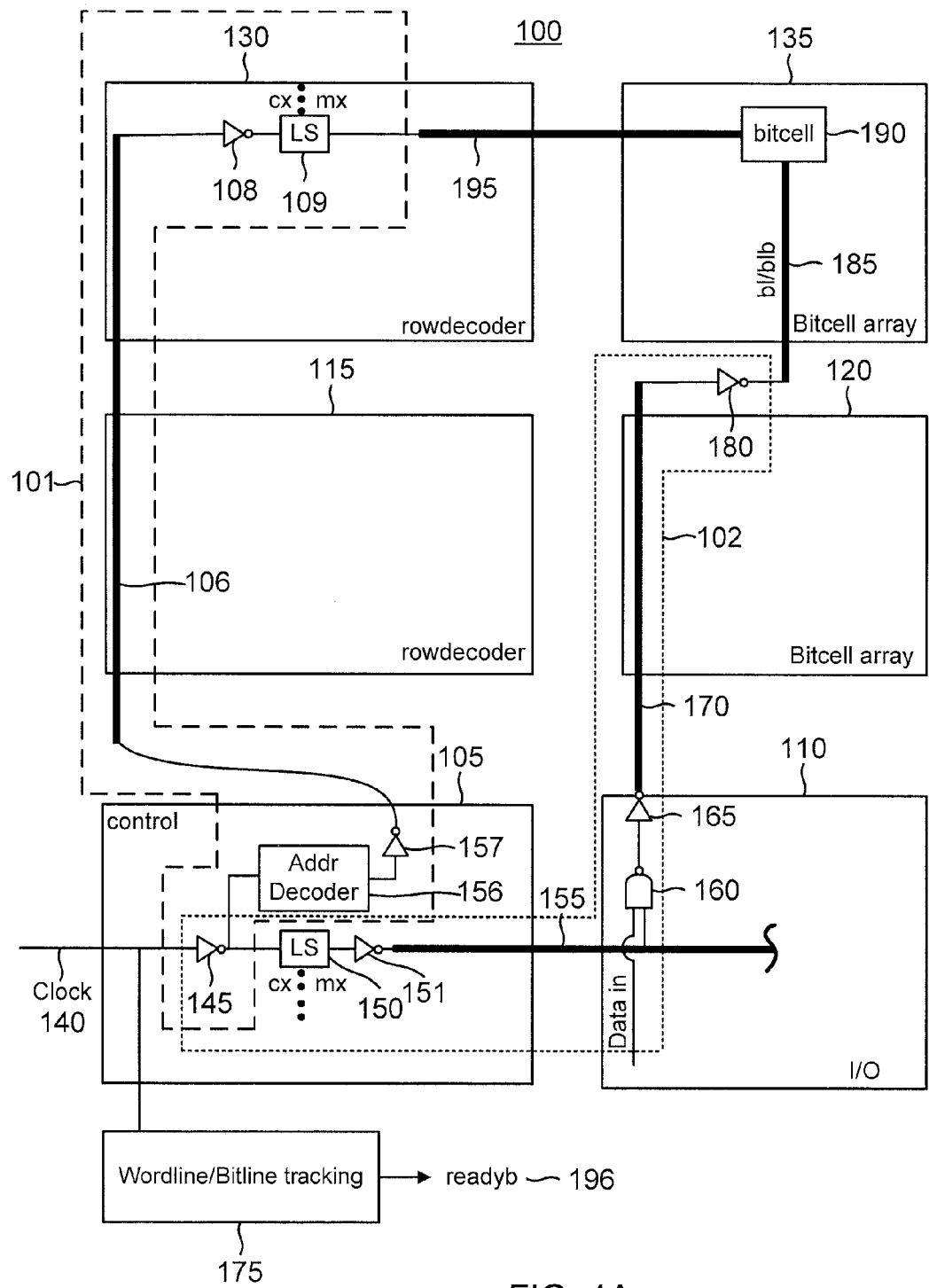
FIG. 1A is a block diagram of a memory including a tracking circuit in accordance with an aspect of the disclosure.
Figure 1B:
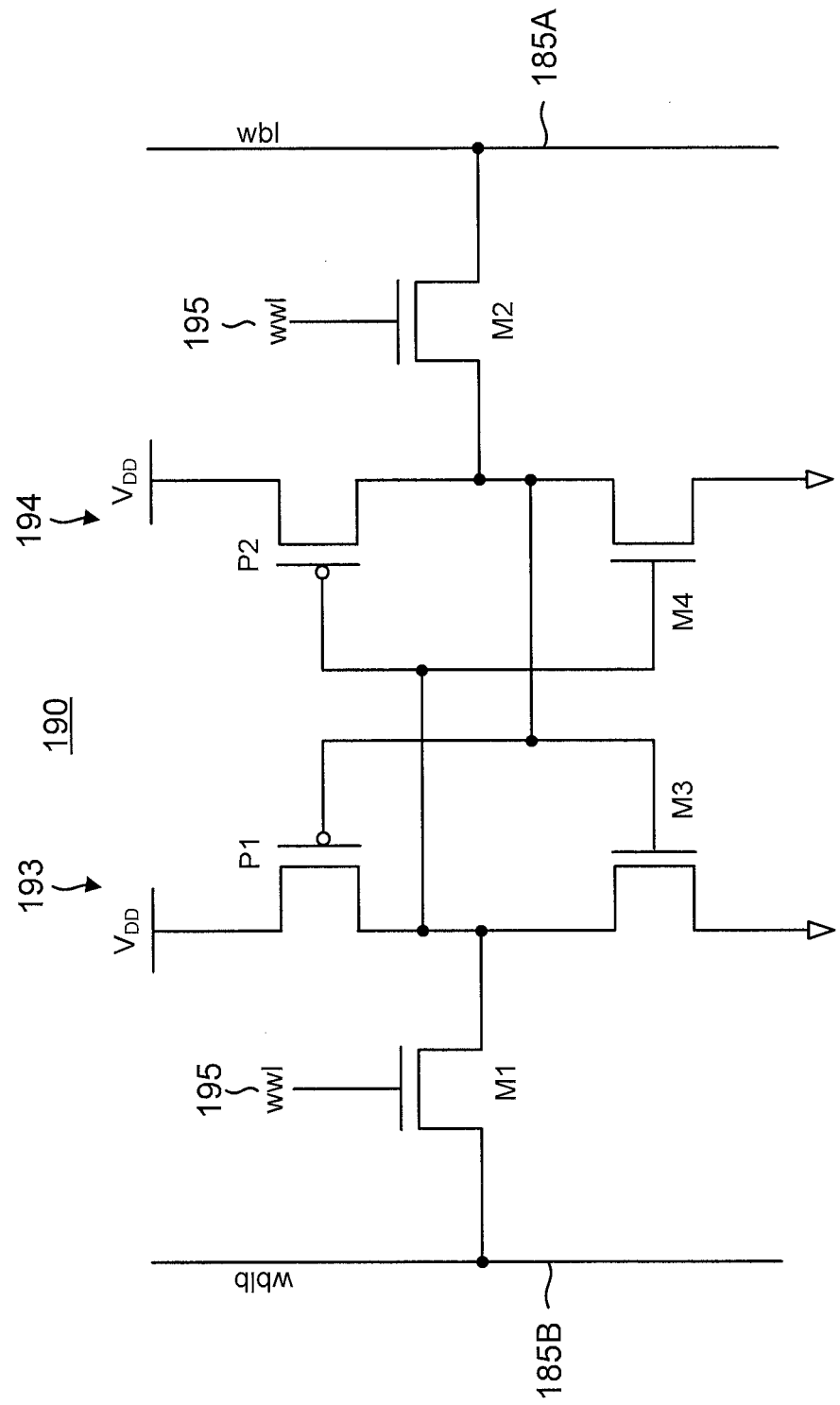
FIG. 1B is a circuit diagram of a bit cell in the memory of FIG. 1A.

These timing concerns may be better appreciated with regard to FIG. 1B illustrating a circuit diagram for bit cell 190. Bit cell 190 includes a first inverter 193 formed by a serial stack of a PMOS transistor P1 and an NMOS transistor M3. Transistor P1 has its source tied to a memory power domain node supplying the memory power supply voltage (VDD). The drain of transistor P1 couples to the drain of transistor M3, which has its source tied to ground. A second inverter 194 formed by a serial stack of a PMOS transistor P2 and an NMOS transistor M4 are arranged analogously as discussed with regard to transistors P1 and M3. The drains of transistors P1 and M3 couple to the gates of transistors P2 and M4. Similarly, the drains of transistors P2 and M4 couple to the gates of transistors P1 and M3 so that first inverter 193 is cross-coupled with second inverter 194. An NMOS first access transistor M1 couples between a complement bit line (wblb) 185B and the drains of transistors P1 and M3 in first inverter 193. Similarly, a NMOS second access transistor M2 couples between a true bit line (wbl) 185A and the drains of transistors P2 and M4 in second inverter 194. Word line 195 drives the gates of access transistors M1 and M2.

Suppose that bit cell 190 had been storing a binary one value such that transistor P2 is conducting to charge its drain to the memory power supply voltage. Conversely, transistors P1 and M4 are off at this time whereas transistor M3 is on to pull its drain to ground. Should a write operation then proceed to write a binary zero, bit cell 190 must be "flipped" in that its binary storage will be changed from a binary one to a binary zero. A similar flip must occur when writing a binary one data bit into a bit cell storing a binary zero bit. With regard to the writing of the binary one data bit, complement bit line 185B and word line 195 are both charged to the memory power supply voltage. Conversely, true bit line 185A is discharged at this time. Transistor P2 will then be switched off and transistor P1 switched on. This completion of the write to bit cell 190 involves contention in that as the voltage for word line 195 is driven high, transistor P2 has not been completely turned off and thus is still charging its drain whereas access transistor M2 is attempting to discharge this drain. This contention takes a bit of time to resolve, whereupon the write operation to bit cell 190 is completed. In turn, the write operation on bit cell 190 cannot occur until word line 195 is asserted to the memory power supply voltage.

Figure 1C:
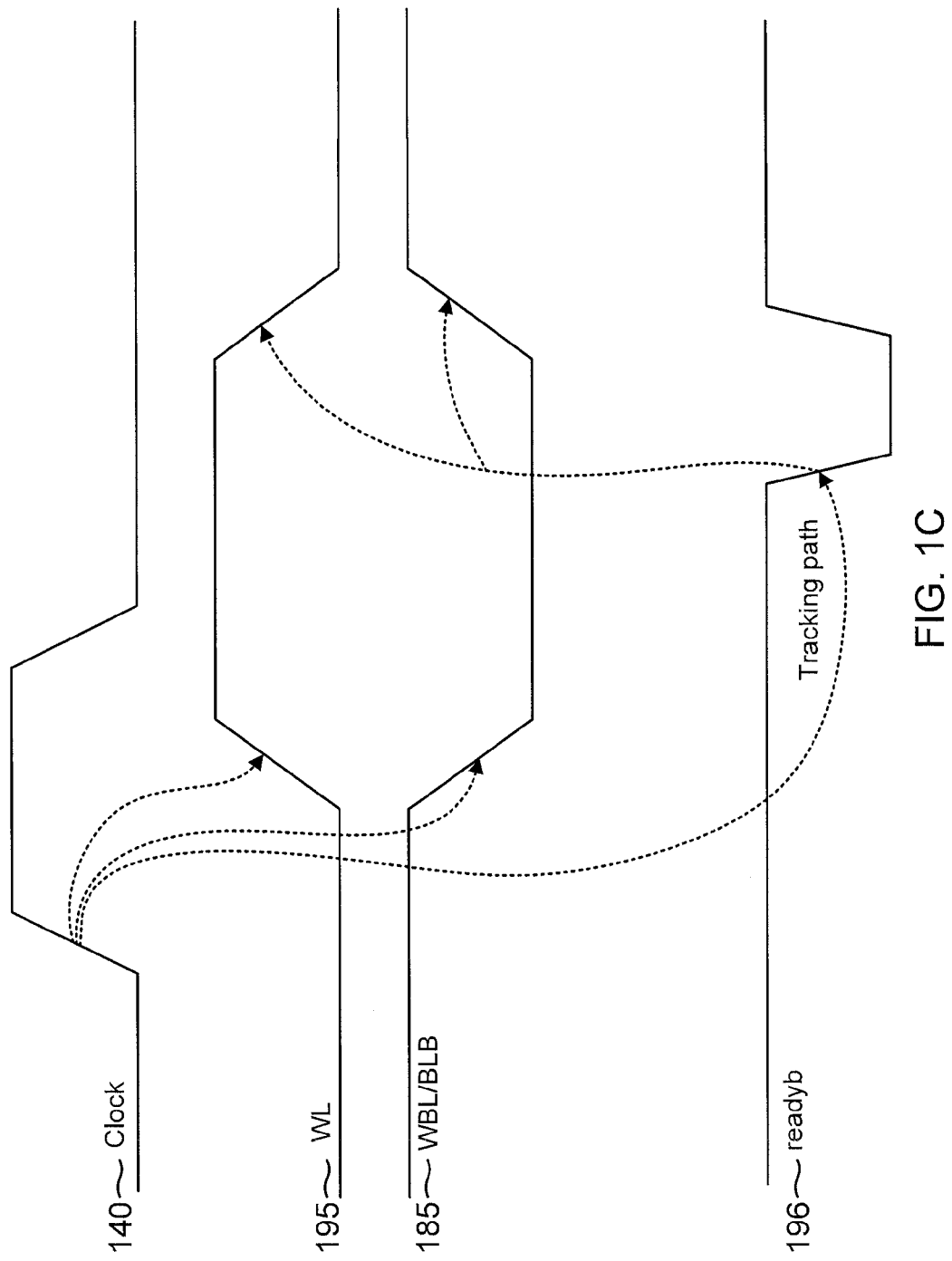
FIG. 1C is a timing diagram for various signals in the memory of FIG. 1A.

The resulting timing for a completed write operation to bit cell 190 is shown in FIG. 1C. A rising edge for a memory clock signal 140 triggers the assertion of word line 195 (WL) and grounding of bit line 185 (WBL/BLB). As discussed above, the development of the word line and bit line voltages must be maintained for a sufficient amount of time to complete the write operation to bit cell 190 (flipping its binary value). Referring again to FIG. 1A, memory 100 is provided with a tracking circuit 175 that models this time with regard to the rising edge of clock 140 to trigger a ready signal (readyb) 196 that is asserted as an active low signal (discharged to ground) to signal that the write operation is completed. In response, word line 195 is discharged to its default grounded state whereas bit line 185 is charged back to its default state (the memory power supply voltage). In alternative aspects of the disclosure, a write operation may be triggered by a falling edge of memory clock signal 140.

With regard to this tracking, it is conventional for a memory to include a tracking circuit that models the delay required to develop the word and bit line voltages as well as the delay necessary to complete the write operation (write the desired data bit into the cell upon development of the word and bit line voltages). But such conventional tracking circuits did not account for the variable delays that are produced in the memory (MX) and logic (CX) power domains depending upon their corresponding variable supply voltages. In that regard, a logic power supply voltage for the logic power domain in an integrated circuit including memory 100 will vary depending upon the mode of operation. Similarly, a memory power supply voltage for the integrated circuit's memory power domain will also vary depending upon the mode of operation. It could thus be that the logic power supply voltage for a particular mode of operation is higher than the memory power supply voltage. Alternatively, the memory power supply voltage may be higher than the logic power supply voltage for other modes of operation.

The varying levels for the power supply voltages leads to corresponding differences in the delay required to assert word line 195 as compared to the delay required to discharge bit line 185. Referring again to FIG. 1A, a word line level-shifter 109 is the only memory-power-domain circuit element in a word line development path 101 from an input for memory clock 140 to a beginning terminal of word line 195. In contrast, the logic-power-domain portion of word line development path 101 extends through from the clock input through an inverter 145, an address decoder 156, an inverter 157, a row decoder bus 106, and an inverter 108 to word line level-shifter 109. It may thus be seen that the logic-power-domain portion of word line development path 101 is substantially larger than the memory-power-domain portion. In contrast, a bit line development path 102 extending from the clock input to an input terminal for bit line 185 has only inverter 145 in the logic power domain prior to a write clock level-shifter 150 that shifts memory clock 140 into a memory-power-domain write clock. The remaining portion of bit line development path 102 is all in the memory power domain and extends from write clock level-shifter 150 through a write clock bus 155, a NAND gate 160, an inverter 165, a bit bus 170 to a final inverter 180 that couples to a beginning terminal of bit line 185. NAND gate 160 NANDs the write clock with a data in bit signal to generate a bit line drive signal that will eventually discharge bit line 185.

The delays through paths 101 and 102 thus have markedly different dependencies on the logic power supply voltage and the memory power supply voltage. Should the mode of operation for an integrated circuit containing memory 100 be such that the logic power supply voltage is greater than the memory power supply voltage, the delay across bit line development path 102 may be greater than the delay across word line development path 101. Conversely if the integrated circuit mode of operation is such that the logic power supply voltage is lower than the memory power supply voltage, the delay across word line development path 101 may dominate over the delay across bit line development path 102. As defined herein, the delay across word line development path 101 is designated as a row decoding period (or equivalently, a row decoding delay). Similarly, the delay across bit line development path 102 is designated herein as a column decoding period (or as a column decoding delay). Advantageously, memory 100 includes a tracking circuit 175 that models the delay across both paths 101 and 102 for all the modes of operation. Regardless of the particular levels for the power supply voltages, tracking circuit 175 accurately models the delays across word line development path 101 and bit line development path 102.

With regard to this modeling, note that it must be tailored to the particular memory architecture being tracked. For example, memory 100 includes a first bank 120 and a second bank 135 of bit cells. A control circuit 105 that includes address decoder 156 and receives memory clock 140 is closer to first bank 120 than to second bank 135. A row decoder 115 corresponds to first bank 120 whereas a row decoder 130 corresponds to second bank 135. Row decoder bus 106 in word line development path 101 must thus extend across row decoder 115 to reach row decoder 130. Similarly, bit bus 170 in bit line development path 102 extends across first bank 120 to reach second bank 135. In general, tracking circuit 175 may model for such a worst-case delay by modeling the row decoding period and column decoding period corresponding to a write operation on the most remote bank of bit cells. In an alternative aspect of the disclosure, tracking circuit 175 may alter the modeled delays depending upon what bank is being written to.

Figure 2:
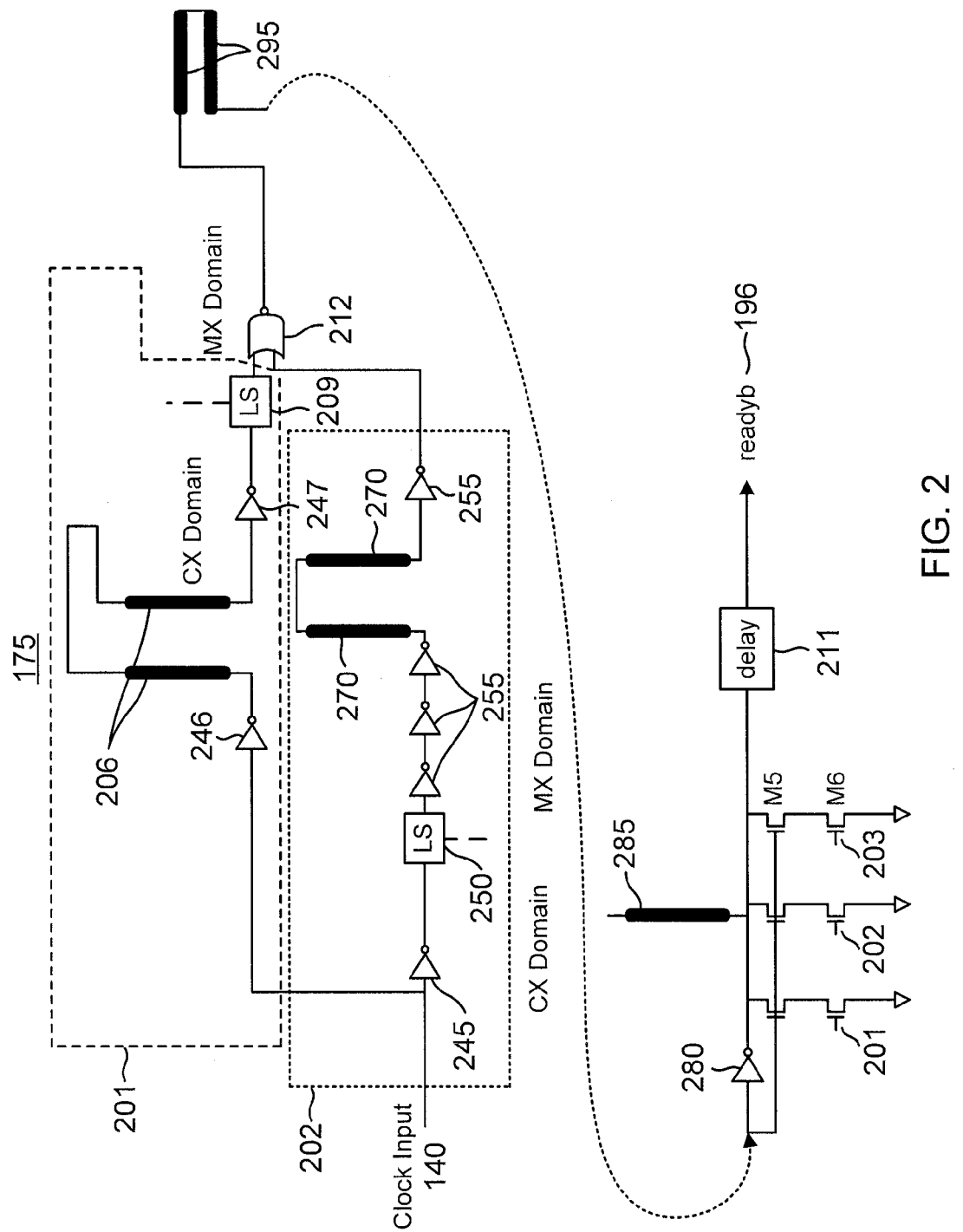
FIG. 2 is a circuit diagram of the tracking circuit in the memory of FIG. 1A.

Tracking circuit 175 is shown in more detail in FIG. 2. A dummy word line development path 201 models the propagation delay across word line development path 101 (FIG. 1A). Similarly, a dummy bit line development path 202 models at least a portion of the propagation delay across bit line development path 102. It will be appreciated that the number of delay elements in paths 201 and 202 depends upon the particular architecture in the memory being tracked. For example, an alternative memory being tracked may have several banks as opposed to the two banks of bit cells discussed with regard to memory 100. Dummy bit line development path 202 and dummy word line development path 201 would then account for these extra banks through the appropriate inclusion of elements. For example, dummy word line development path 201 includes a dummy row decoder bus 206 that models the delay in row decoder bus 106 in memory 100. Dummy row decoder bus 206 thus may have substantially the same length and electrical characteristics (resistance, inductance, and capacitance) as does row decoder bus 106. Note that row decoder bus 106 may comprise a conductive trace formed in a metal layer adjacent the active semiconductor die surface (not illustrated) in which memory 100 is integrated. The length of row decoder bus 106 (and hence the length of the conductive trace in the corresponding metal layer) is sufficient to extend from control circuit 105 across row decoder 115 to row decoder 130. In general, this length would be increased for a memory having more banks and decreased for a memory having just one bank of memory cells. Regardless of the exact architecture for memory 100, dummy row decoder bus 206 may be formed in a metal layer trace matching the length and electrical characteristics for row decoder bus 106.

In tracking circuit 175, dummy row decoder bus 206 is folded into two separate traces to provide better density. For example, suppose row decoder bus 106 extends for 100 microns. It would decrease density to have tracking circuit 175 extend across such a length. So dummy row decoder bus 206 may instead have a first trace that extends out one-half of the desired distance and another trace that extends back the same length. In memory 100, the triggering of row decoder bus 106 is delayed with respect to the corresponding edge in memory clock signal 140 by an inverter 145, address decoder 156, and an inverter 157. The delay through these elements is modeled in dummy row decoder bus 206 by an inverter 246. It will be appreciated that additional delay elements such as another inverter may be inserted into dummy word line development path 201 prior to dummy row decoder bus 206 so that path 201 has the proper delay prior to the triggering of dummy row decoder bus 206. In word line development path 101 of memory 101, row decoder bus 106 is followed by an inverter 108 and word line level-shifter 109. Similarly, dummy word line development path 206 includes an inverter 247 and a dummy word line level-shifter 209 following dummy row decoder bus 206. Dummy word line level-shifter 209 is the end terminal for dummy word line development path 201. Dummy word-line level-shifter 209 mimics the processing delay of word line level-shifter 109. Similarly, inverter 247 mimics the delay through inverter 108.

The construction of dummy bit line development path 202 is analogous in that it depends upon the bus length and electrical properties as well as the circuit processing delays in corresponding bit line development path 102. In bit line development path 102, clock signal 140 is processed by an inverter 145 prior to bit line level-shifter 150. Inverter 145 is the only delay element solely in the logic power domain (CX) for bit line development path 102. Similarly, dummy bit line development path 202 begins with an inverter 245 followed by a dummy bit line level-shifter 250. Inverter 245 is configured to mimic the delay through inverter 145 whereas dummy bit line level-shifter 250 is configured to mimic the processing delay through bit line level-shifter 150. The remaining major portion of both paths 102 and 202 is solely within the memory power domain (MX). Inverters 255 in dummy bit line development path 202 mimic the delay caused by corresponding inverter 151, NAND gate 160, inverter 165, and inverter 180 in bit line development path 102. A dummy bit bus 270 has substantially the same length and electrical characteristics as bit bus 170. In that regard, bit bus 170 is similar to row decoder bus 106 in that it too may be formed as a trace in a metal layer adjacent the active semiconductor surface in which memory 100 is integrated. Dummy bit bus 270 may thus also comprise a trace in a metal layer having the same electrical characteristics as that used to form bit bus 170. Like dummy row decoder bus 206, dummy bit bus 270 may be folded to increase density.

Note that word line 195 in memory 100 extends in a row direction from row decoder 130 to bit cell array 135. Similarly, write clock bus 155 in bit line development path 102 extends in the row direction from control circuit 105 to I/O circuit 110. Given such similar lengths and electrical characteristics, it is unnecessary in such an aspect of the disclosure to separately model the delays on both word line 195 and write clock bus 155. In other words, the delay required to propagate a signal through word line 195 is substantially similar to the delay required to propagate a signal through write clock bus 155. Referring again to dummy bit line development path 202, it may thus be observed that there is no dummy write clock bus in that the corresponding delay will be accounted for with regard to a dummy word line 295. Dummy bit line development path 202 thus models or simulates the column decoding period for memory 100 minus the write clock bus charging delay. However, dummy bit line development path 202 may include a dummy write clock bus in alternative aspects of the disclosure in which the delays across word line 195 and write clock bus 155 differ from each other such that it would be inaccurate not to account for the difference in delays.

In tracking circuit 175, a logic gate such as NOR gate 212 processes the outputs from paths 201 and 202. The function of this logic gate is to only assert its output after both paths 201 and 202 have completed their propagation delay with respect to the corresponding edge in memory clock signal 140. In a NOR gate aspect of the disclosure, both paths 201 and 202 are configured to assert their output signal low in response to memory clock signal 140 being asserted high. The default state for the outputs from paths 201 and 202 would then be high (the memory power supply voltage) while memory clock signal 140 is low. The output from NOR gate 212 would then be low in this default state. Depending upon the relative values of the power supply voltages, either dummy bit line development path 202 or dummy word line development path 201 will be the first to pull its output signal low in response to the rising edge of memory clock signal 140. For example, suppose that the logic power supply voltage is sufficiently greater than the memory power supply voltage such that word line development path 101 has a faster propagation time than bit line development path 102. Dummy paths 201 and 202 mimic this delay difference such that dummy path 201 would be the first to discharge its output signal low to NOR gate 212. The output signal from dummy path 202 would then still be in its default high state until the propagation delay is completed across dummy path 202, whereupon both input signals to NOR gate 212 are pulled low to ground. At this point, NOR gate 212 drives its output signal high to drive dummy word line 295 with the memory power supply voltage. Alternatively, it may be that propagation across bit line development path 102 is faster such that it would be dummy bit line development path 202 that would first pull its output signal low.

NOR gate 212 would then not assert its output high until the propagation across dummy word line development path 201 has been completed.

Dummy word line 295 has substantially the same length and electrical characteristics as word line 195. Word line 195 is analogous to row decoder bus 106 in that it is formed as a trace in a metal layer. Dummy word line 295 is thus also formed as a trace in a similar metal layer. Like dummy row decoder bus 206, dummy word line 295 may be folded to increase density. Referring again to FIG. 1A, there is a word line charging delay between word line level-shifter 109 driving its output signal high and this same high voltage state propagating down word line 195 to drive bit cell 190. Due to the matching between word line 195 and dummy word line 295, dummy word line 295 mimics this word line charging delay.

After its output signal is inverted in an inverter 280, the assertion of dummy word line 295 discharges a dummy bit line 285 that substantially matches the length and electrical characteristics of bit line 185. Bit line 185 is analogous to word line 195 in that it may also be formed as a trace in a metal layer. Dummy bit line 285 is thus formed as a matching trace in an electrically-similar metal layer in such aspects of the disclosure. Since bit line 185 is typically shorter than word line 195, it may not be necessary to fold dummy bit line 285 due to is relatively short electrical length. However, it may be folded in alternative aspects of the disclosure analogous to the folding of dummy word line 295. To provide for process corner tuning regarding the discharge speed for dummy bit line 295, dummy bit line 295 couples to ground through three selectable legs, each including an NMOS transistor M6. The gate of transistor M6 in a first leg is controlled by a tuning signal 201. Similarly, a tuning signal 202 drives a gate of transistor M6 in a second leg whereas a tuning signal 203 drives a gate of transistor M6 in a third leg. Each leg includes an NMOS transistor M5 that couples between dummy bit line 285 and the corresponding transistor M6. Each transistor M5 is driven by the output of dummy word line 295 such that when dummy word line 295 is asserted, transistors M5 in the legs are all conducting. If all three tuning signals 201, 202, and 203 are asserted, then all three legs would discharge dummy bit line 295 upon the assertion of dummy word line 295. Such a configuration would mimic a fast process corner. Alternatively, if all three tuning signals 201, 202, and 203 are de-asserted to ground, then none of the selectable legs would be conducting. Such a condition would mimic a slow process corner. The discharge of dummy bit line 285 would then depend solely on inverter 280, which may include a weak NMOS transistor to further mimic a slow process corner condition. By appropriate assertion of tuning signals 201, 202, and 203, the desired process corner may thus be simulated.

Once dummy bit line 285 is discharged, the time to complete the write operation to bit cell 190 (flipping the bit cell) is simulated through a delay circuit 211. Once delay circuit 211 pulls its output ready signal (readyb) 196 low after the desired delay, memory 100 may release the assertion of word line 195 and recharge bit line 185. The circuitry for such release in response to an indication from a tracking circuit in a memory is conventional and is thus not illustrated in memory 100. With regard to memory 100, it will be appreciated that tracking circuit 175 models the power-supply-voltage-dependent delays across word line development path 101, bit line development path 102, word line 195, bit line 185, and bit cell 190 with regard to completing a write operation. In contrast, prior art tracking circuits did not model these delays as it was assumed that the word line development delay would dominate. Such an assumption is inaccurate with regard to the diverse power domains used in modern memories. In contrast, tracking circuit 175 accounts for the variable delays induced by the various levels for the logic power supply voltage and the memory power supply voltage.

In one aspect of the disclosure, dummy word line development path 201 may be deemed to comprise a means for asserting a first output signal upon completion of a simulated row decoding period for a write operation in a memory using a first delay path in a logic power domain. Similarly, dummy bit line development path 202 may be deemed to comprise a means for asserting a second output signal upon completion of a simulated column decoding period for the write operation using a second delay path in a memory power domain.

Figure 3:
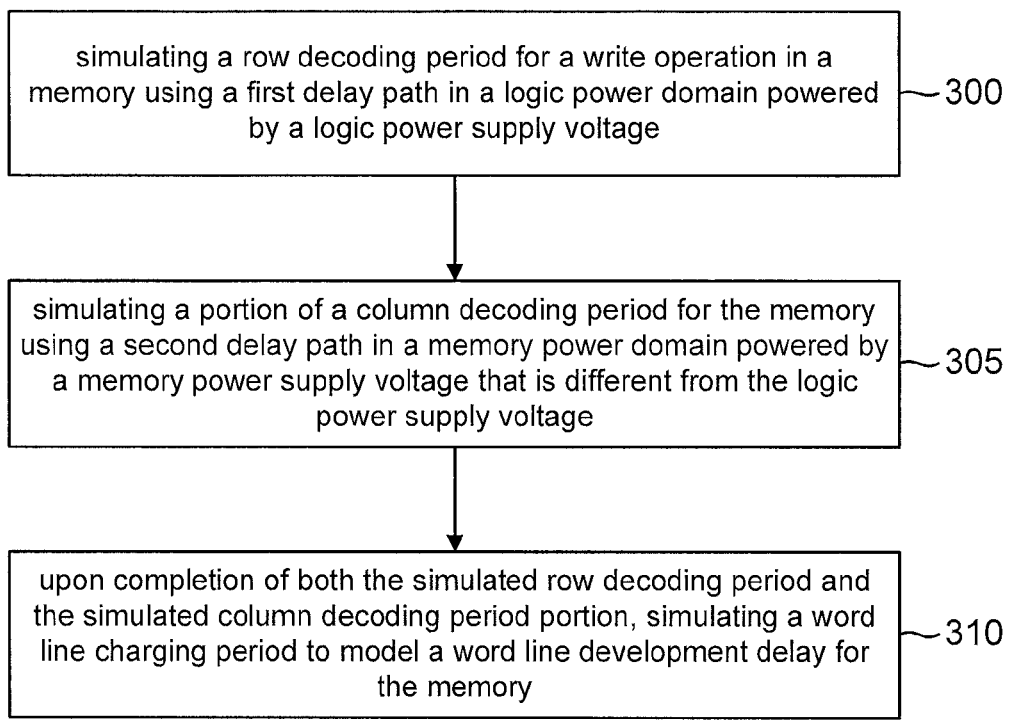
FIG. 3 is a flowchart for an example method of operation for the memory of FIG. 1A.

A method operation for a tracking circuit will now be discussed. A flowchart for an example method is provided in FIG. 3. The method begins with an act 300 that comprises simulating a row decoding period for the write operation using a first delay path in a logic power domain powered by a logic power supply voltage. The use of dummy word line development path 201 in tracking circuit 175 is an example of act 305.

The method further includes an act 305 that comprises simulating a portion of the column decoding period for the memory using a second delay path in a memory power domain powered by a memory power supply voltage that is different from the logic power supply voltage. The use of dummy bit line development path 202 in tracking circuit 175 is an example of act 310.

Finally, the method includes an act 310 that occurs upon completion of both the simulated row decoding period and the simulated column decoding period portion and comprises simulating a word line charging period to model a word line development delay for the memory. The driving of dummy word line 295 in tracking circuit 175 responsive to NOR gate 212 asserting its output signal is an example of act 315.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular aspects of the disclosure illustrated and described herein, as they are merely by way of some examples thereof, but rather, should be fully commensurate with that of the claims appended hereafter and their functional equivalents.

What is claimed is:

1. A circuit, comprising:
a first delay circuit configured to delay a memory clock by a simulated row decoding period to produce a first output signal, the first delay circuit including a logic-power-domain portion configured to delay a memory clock signal to provide a delayed signal, the first delay circuit further including a first level-shifter configured to level shift the delayed signal according to a memory power supply voltage to produce the first output signal;
a second delay circuit configured to delay the memory clock signal by a simulated column decoding period to produce a second output signal, the second delay circuit including a second level-shifter configured to level shift the memory clock signal into a memory-power-domain dummy write clock, the second delay circuit further including a memory-power-domain portion configured to delay the dummy write clock into the second output signal; and
a logic circuit configured to process the first output signal and the second output signal to assert a logic output signal responsive to a completion of both the simulated row decoding period and the simulated column decoding period.

2. The circuit of claim 1, further comprising:
a memory-power-domain word line;
a word line development path configured to assert the word line to the memory power supply voltage responsive to an edge of the memory clock signal, wherein a delay between the assertion of the word line voltage and the edge of the memory clock signal equals a row decoding period, and wherein the first delay circuit is configured so that the simulated row decoding period substantially equals the row decoding period.

3. The circuit of claim 2, wherein the word line development path includes a row decoding bus having a first length, and wherein the first delay circuit includes a dummy row decoding bus having a second length substantially equaling the first length.

4. The circuit of claim 3, wherein the dummy row decoding bus comprises a folded dummy row decoding bus.

5. The circuit of claim 1, further comprising:
a dummy word line, wherein the logic gate is configured to drive the dummy word line with the asserted logic output signal; and
a dummy bit line configured to be discharged responsive to an assertion of the dummy word line.

6. The circuit of claim 5, further comprising:
a third delay circuit configured to assert a ready output signal responsive to a completion of a simulated write operation period subsequent to the discharge of the dummy bit line, wherein the simulated write operation period substantially equals a write operation period for a memory bit cell.

7. The circuit of claim 5, further comprising:
a plurality of selectable legs coupled between the dummy bit line and ground, wherein each selectable leg is controlled to conduct by a corresponding tuning signal.

8. The circuit of claim 1, further comprising:
a memory-power-domain bit line;
a bit line development path configured to discharge the bit line responsive to an edge of the memory clock signal and responsive to a data signal to be written to a bit cell, wherein a delay between the discharge of the bit line and the edge of the memory clock signal equals a column decoding period, and wherein the second delay circuit is configured so that the simulated column decoding period equals at least a portion of the column decoding period.

9. The circuit of claim 8, wherein the second delay circuit includes a dummy bit bus having a length configured to model a transmission delay across at least one memory bank.

10. The circuit of claim 8, wherein the bit line development path includes a write clock bus having a write clock bus propagation delay, and wherein the second delay circuit is configured so that the simulated column decoding period substantially equals the column decoding period minus the write clock bus propagation delay.

11. The circuit of claim 7, further comprising an inverter coupled between the dummy word line and the dummy bit line, wherein the inverter is configured to discharge the dummy bit line responsive to an assertion of the dummy word line.

12. The circuit of claim 9, wherein the dummy bit bus comprises a corresponding trace in a metal layer.

13. The circuit of claim 9, wherein the dummy bit bus comprises a folded dummy bit bus.

* * * * *